US008968971B2

(12) United States Patent
Wang (10) Patent No.: US 8,968,971 B2
(45) Date of Patent: Mar. 3, 2015

(54) PELLICLES WITH REDUCED PARTICULATES

(71) Applicant: Micro Lithography, Inc., Sunnyvale, CA (US)

(72) Inventor: Ching-Bore Wang, Fremont, CA (US)

(73) Assignee: Micro Lithography, Inc., Sunnyvale, CA (US)

( * ) Notice: Subject to any disclaimer, the term of this patent is extended or adjusted under 35 U.S.C. 154(b) by 190 days.

(21) Appl. No.: 13/789,894

(22) Filed: Mar. 8, 2013

(65) Prior Publication Data

US 2014/0255827 A1   Sep. 11, 2014

(51) Int. Cl.
*G03F 1/64* (2012.01)
(52) U.S. Cl.
CPC ........................................ *G03F 1/64* (2013.01)
USPC ............................................................ 430/5
(58) Field of Classification Search
CPC ........................................................ G03F 1/64
USPC .................................................... 430/5, 322
See application file for complete search history.

(56) References Cited

U.S. PATENT DOCUMENTS

| 6,573,980 B2 | 6/2003 | Wang |
| 6,646,720 B2 | 11/2003 | Ramamoorthy et al. |
| 6,727,029 B1 * | 4/2004 | Wu et al. ........................... 430/5 |
| 6,753,945 B2 | 6/2004 | Heerens et al. |
| 7,413,586 B2 | 8/2008 | Ramamoorthy et al. |

FOREIGN PATENT DOCUMENTS

JP   2005049879 A   2/2005

OTHER PUBLICATIONS

Oriel Instruments, "Pellicle Beam Splitters product brochure," Dec. 18, 2012, pp. 1-2.
Zimmerman, John, "Progress on EUV Reticle Dual Pod Carriers for Use in the Fab and Exposure Tools," EUVL Symposium, Sep. 29-Oct. 2, 2008; pp. 1-19.
Shroff, Yashesh A. et al., "High Transmission EUVL Pellicle Development," 2008 EUVL Symposium, Lake Tahoe, pp. 1-23.
Entegris Inc., "Extreme Ultraviolet Light Reticle Pod product brochure," www.entegris.com, 2013, pp. 1-2.
IMEC, "2012 EUVL Symposium Sees Steady Progress Towards EUVL Introduction in High-Volume Manufacturing," http://www2.imec.be/be_en/press/imec-news/euvsymposium2012.html, Nov. 1, 2013, p. 1.

* cited by examiner

*Primary Examiner* — Stephen Rosasco
(74) *Attorney, Agent, or Firm* — Schwabe, Williamson & Wyatt (57) ABSTRACT

Pellicles for photomasks used in photolithographic manufacturing are described. A frame of a pellicle may include a recess formed in a side member and a locking member dimensioned to secure a membrane to the frame when the membrane is disposed between the recess and the locking member. A pellicle may be secured to a photomask using non-adhesive attachment members that contact a side surface of the photomask.

13 Claims, 5 Drawing Sheets

PELLICLES WITH REDUCED PARTICULATES

TECHNICAL FIELD

This disclosure relates to pellicles for photomasks used in photolithographic manufacturing.

BACKGROUND

The manufacture of semiconductor devices typically involves applying a layer of a photosensitive substance (a photoresist) to the surface of a target wafer. The photoresist is exposed to light in a selected pattern using a photomask, and the photoresist is then developed to leave exposed regions of the wafer. Typically, the exposed regions are subsequently etched away or otherwise modified, and the residual photoresist is removed. The pattern of the photomask typically possesses extremely fine details, and the presence of even tiny particles on the surface of the photomask can interfere with the accurate reproduction of the pattern on the target wafer.

To minimize particulate contamination at the mask surface, optical pellicles have been developed that protect the photomask. An optical pellicle includes a frame-mounted transparent membrane, and is attached to the photomask surface, so that contaminating particles fall onto the pellicle membrane and not the surface of the photomask. The pellicle frame holds the pellicle membrane at a sufficient distance above the mask surface so that any particles that may fall upon the membrane lie outside the focal plane of the illuminating light, and so fail to interfere with the projected mask pattern. The use of optical pellicles in semiconductor manufacture has helped mitigate the effects of contamination by dust and other particulates, and has become widespread in the industry.

Multiple barriers to achieving fast, cost-effective, high-quality photolithographic reproduction remain. A first barrier is contamination of the photomask. In particular, when a pellicle is removed from a photomask (e.g., because the pellicle has reached the end of its operational lifetime), particulate contaminants are often generated. These contaminants may include small fragments of the adhesive traditionally used to secure the pellicle to the photomask, and particulate generated by mechanical contact between tools used to remove the pellicle and the pellicle and/or photomask, for example. Additionally, solvents typically included in pellicle adhesives may outgas when the pellicle is exposed to inspection or exposure illumination sources, which may distort the electromagnetic radiation as it passes through the pellicle and the photomask.

A second barrier is the inadequacy of traditional methods and pellicle materials in high energy photolithography. Demand for smaller, faster, and more powerful microprocessors has required the semiconductor industry to fabricate ever smaller and faster semiconductor circuits. Manufacturing techniques have advanced to the point that the size of the circuit being produced is effectively limited by the wavelength of light used in the photolithographic process, with shorter wavelength illumination permitting finer details in the resulting circuit structure. Photolithography using 248 nm, 193 nm, and 157 nm illumination (in the deep ultraviolet, or DUV, range), as well as photolithography using 13.6 nm illumination (in the extreme ultraviolet, or EUV, range), are known.

However, the organic materials typically used as pellicle membranes tend to break down under DUV and EUV illumination, and thus cannot protect the photomask during photolithography processes at DUV and EUV wavelengths. Attempts to develop a pellicle membrane that can withstand EUV illumination (for example, a metal mesh) remain hindered by material brittleness, the challenges of eliminating outgassing contaminants, and the lack of sufficiently reliable procedures for cleaning and manufacturing. Additionally, such pellicle membranes, although transparent to EUV illumination, are not transparent at the wavelengths used to inspect a photomask for defects (typically around 193 nm) prior to EUV photolithography. Thus, such pellicle membranes must be removed during inspection, generating particulate contamination and risking damage to the photomask.

SUMMARY

Pellicles and methods of using pellicles are disclosed herein. In some embodiments, a pellicle frame as disclosed herein includes a side member having a recess formed in a first surface thereof, the recess forming a closed path in the first surface. The pellicle frame also includes a locking member dimensioned to secure a membrane to the pellicle frame when a portion of the membrane is disposed between the recess and the locking member. The pellicle frame further includes a non-adhesive attachment member to secure the side member to a photomask.

In some embodiments, a method includes providing a photomask and a pellicle, the photomask having a top surface, a side surface, and a bottom surface, and the pellicle including a membrane extending across a pellicle frame in a plane substantially parallel to a plane of a top surface of the photomask. The pellicle is secured to the photomask at least in part by contact between the pellicle frame and the side surface of the photomask. The method further includes separating the pellicle from contact with the photomask by displacing the pellicle in a direction perpendicular to the top surface and illuminating the photomask with an exposure illumination source without the pellicle being interposed between the exposure illumination source and the photomask.

By using the apparatuses of the present disclosure, and/or by practicing the methods of the present disclosure, some or all of the drawbacks encountered with prior art apparatuses and methods may be reduced. Other various objects and advantages which are attained by the disclosed apparatuses and methods will become more fully apparent as the description which now follows is read in conjunction with the drawings.

DETAILED DESCRIPTION

Figure 1A:
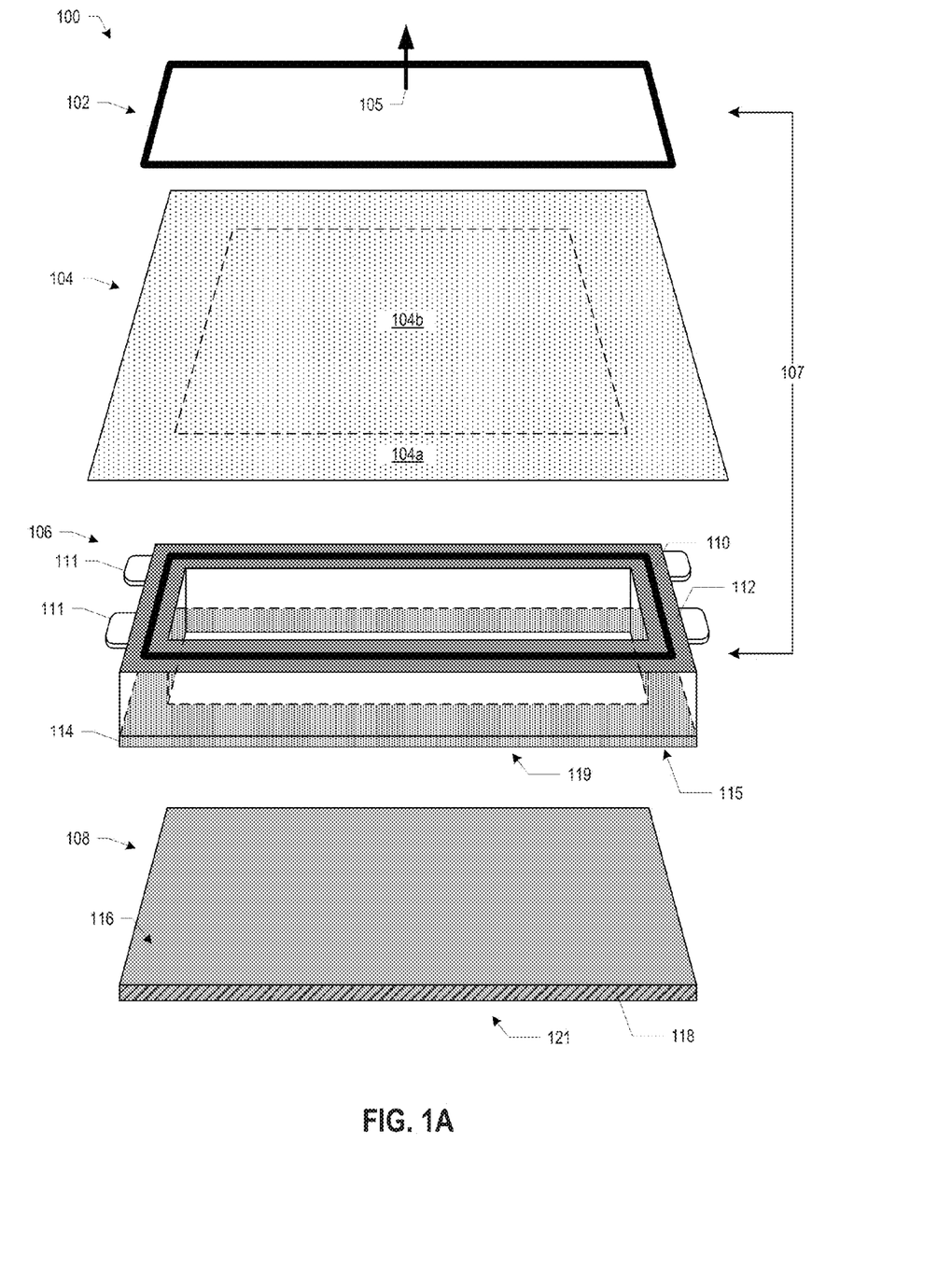
FIG. 1A is an exploded perspective view of a first embodiment of a pellicle with a locking member and a recess in a pellicle frame, with the pellicle secured to a photomask.

FIG. 1A is an exploded perspective view of a first embodiment of a pellicle 100, including a membrane 104 and a pellicle frame 107 having a locking member 102 and a side member 106. Side member 106 has a recess 110 formed in a top surface 112, into which locking member 102 is dimensioned to at least partially fit. In particular, locking member 102 is dimensioned to secure membrane 104 to pellicle frame 107 when a portion of membrane 104 is disposed between recess 110 and locking member 102. In some embodiments, membrane 104 may be secured to pellicle frame 107 by placing membrane 104 on top surface 112, placing locking member 102 on membrane 104 so that locking member 102 is substantially in alignment with recess 110, and pressing locking member 102 into recess 110 to capture some of the outer portion 104a of membrane 104 between recess 110 and locking member 102.

When membrane 104 is secured to pellicle frame 107, an inner portion 104b of membrane 104 extends across pellicle frame 107 in a plane substantially parallel to a plane of a top surface 116 of the photomask 108. Pellicle frame 107 holds membrane 104 in a spaced relationship from top surface 116 of photomask 108, keeping unwanted particles and debris away from the focal plane of photomask 108. It should be understood that the pellicles disclosed herein may be any shape that facilitates their use in conjunction with a particular photomask. While generally depicted herein as rectangular, a pellicle may be any other shape that is well-suited to protect the entire mask pattern of a photomask without obscuring any portion of that mask pattern.

Side member 106 may be shaped from a rigid material, such as aluminum, aluminum alloy, stainless steel, polyethylene resin, or other appropriate metals or polymers. Materials that are light and yet possess high mechanical strength and hardness are preferred for side member 106. In some embodiments, side member 106 is formed from aluminum or an aluminum alloy that has been anodized to improve the chemical stability of side member 106 and stained black to minimize the influence of stray light during photolithographic exposure. Various embodiments of locking member 102 may be formed from metal(s), plastic(s), or a combination.

Membrane 104 is composed of any material with an ability to transmit a substantial percentage of incident electromagnetic radiation with minimal distortion. High transmissivity material absorbs a small enough proportion of incident imaging radiation to allow effective imaging of the photomask pattern on the substrate. Typically, a high transmissivity membrane absorbs less than half of incident imaging radiation, and may have an average transmissivity of about 80%, 90%, or 95%. More preferably, a membrane may have a transmissivity of over 99% at a desired wavelength. Membrane 104 has a thickness defined by practical considerations related to manufacturing, handling, and use. In general, membrane 104 may be as thin as is practicable to minimize absorption of radiation. On the other hand, membrane 104 is thick enough to facilitate production and to resist mechanical damage with normal use. Membrane 12 may have a thickness of about 0.5 microns to about 2 .microns, about 0.6 microns to about 1.7 microns, or about 0.8 microns to about 1.5 microns. In most cases, the thickness of membrane 104 is uniform to minimize optical distortion. Membrane 106 may be formed from a pane of glass, quartz glass, a polymer such as nitrocellulose, cellulose acetate, modified polyvinyl alcohol, or a fluorocarbon polymer. Membrane 104 may optionally be treated with an anti-reflective coating.

Figure 1B:
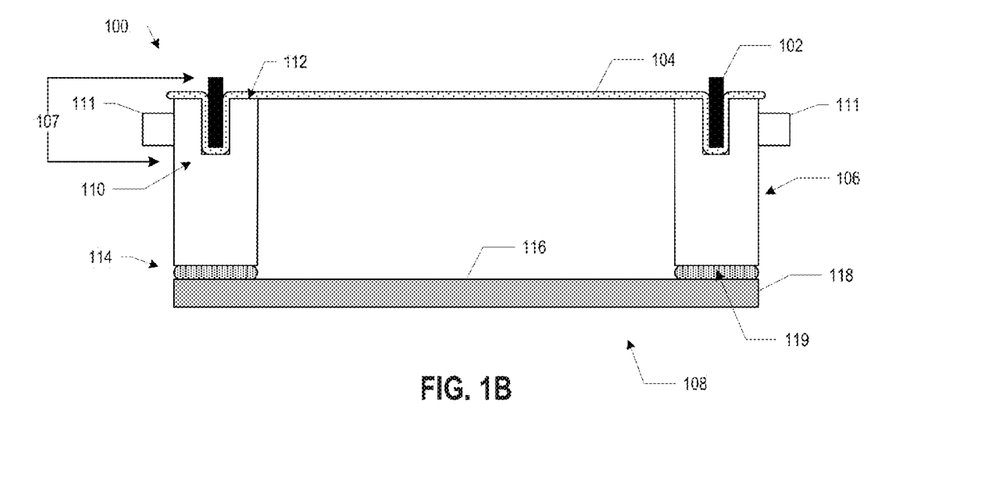
FIG. 1B is a side elevation sectional view of the pellicle embodiment and photomask of FIG. 1A.

In some embodiments, recess 110 forms a closed path in first surface 112. For example, as shown in FIG. 1A, recess 110 forms a closed, substantially rectangular path in first surface 112. As used herein, "rectangular" includes both square and non-square rectangular shapes. In some embodiments, recess 110 is rectangular in cross-section. An example of recess 110 with a rectangular cross-section is illustrated in FIG. 1B, which includes a side elevation sectional view of pellicle 100 of FIG. 1A.

In some embodiments, the shape of locking member 102 is approximately complementary to the shape of recess 110 in one or more dimensions. In some embodiments, the shape of locking member 102 is not complementary to the shape of recess 110 in one or more dimensions. For example, the thickness of locking member 102 (as measured in the direction indicated by the arrow 105 may be larger or smaller than the depth of recess 110 (as measured in the direction of arrow 105). In another example, locking member 102 may be formed by one or more sub-members (e.g., four straight sub-members corresponding to the four sides of the rectangular path of recess 110) rather than one continuous member as shown in FIG. 1A. In some embodiments, the dimensions of locking member 102 and recess 110 may be selected in any number of ways that provide a snug fit between locking member 102, membrane 104 and side member 106 so as to secure membrane 104 to pellicle frame 107 when membrane 104 is disposed between recess 110 and locking member 102. In preferred embodiments, the portion of membrane 104 disposed between recess 110 and locking member 102 forms a continuous closed path on membrane 104 to provide a continuous barrier against the entry of contaminants.

In some embodiments, pressing locking member 102 into recess 110 to secure membrane 104 to pellicle frame 107 results in the tensioning of inner portion 104b of membrane 104. This tensioning may improve the uniformity of the inner portion 104b of the membrane 104 when pellicle 100 is assembled. In some embodiments, after securing membrane 104 between recess 110 and locking member 102, membrane 104 may be cured by exposure to UV light and then any excess material from outer portion 104a of membrane 104 may be trimmed away.

Pellicle frame 107 also includes four handles 111. Each handle 111 is positioned such that, when pellicle frame 107 is secured to photomask 108, pellicle frame 107 is separable from the photomask by applying a force to one or more of handle 111 in a direction substantially perpendicular to and away from a plane of top surface 116 of photomask 108 (in FIG. 1A, in the direction of arrow 105). Handles 111 may facilitate the engagement of attachment member 114 with top surface 116 of photomask 108, and/or may facilitate the detachment of the attachment member 114 from top surface 116 of photomask 108. Appropriate handles 111 may include any of a variety of shapes designed to interface with an appropriate tool, including any of a number of depressions, projections, ridges, slots, knobs, or other surface features intended to aid the manipulation of handles 111. In various embodiments, none, one, two, or more handles 111 may be included.

Figure 2:
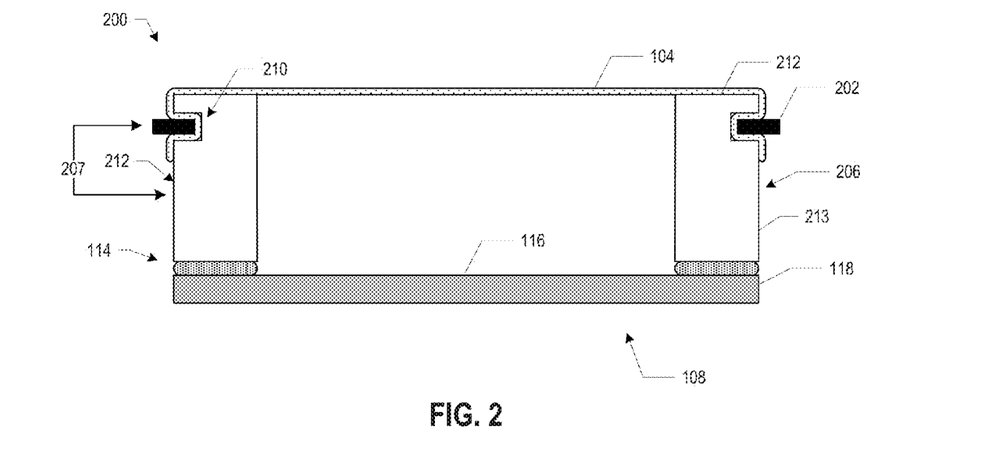
FIG. 2 is a side elevation sectional view of a second embodiment of a pellicle with a locking member and a recess in a pellicle frame, with the pellicle secured to a photomask.

Pellicle frame 107 also includes a non-adhesive attachment member 114 to secure side member 106 to a photomask 108. In some embodiments, as shown in FIGS. 1A-1B and 2, recess 110 is formed near a top of side member 106 (i.e., the portion of side member 106 distal to photomask 108 and proximal to top surface 112) and attachment member 114 is disposed near a bottom of side member 106 (i.e., the portion of side member 106 proximal to photomask 108 and bottom surface 119). Attachment member 114 may include attachment material distributed substantially continuously along bottom surface 119, or may include attachment material distributed at discrete positions along bottom surface 119 or proximal to bottom surface 119. For example, attachment member 114 may include a suction material positioned to contact a top surface 116 of photomask 108. The suction material may include one or more discrete suction cups (e.g., positioned on bottom surface 119 at the four corners of side member 106) or a continuous suction material such as a micro-suction acrylic sheet with suction holes. Additional examples of non-adhesive attachment member 114 that may be used with the embodiments disclosed herein are described in U.S. Pat. No. 6,573,890 to Ching-Bore Wang, entitled "Removable Optical Pellicle," which is hereby incorporated by reference herein in its entirety. The non-adhesive attachment members discussed herein can be rapidly and readily engaged with a surface of photomask 108 to affix a pellicle securely enough for routine handling, and yet can also readily disengaged, leaving no adhesive residue on the surface of photomask 108 itself. Additional embodiments of non-adhesive attachment members are discussed in detail below.

A second embodiment of a pellicle with a locking member and a recess in a side member of a pellicle frame is illustrated in FIG. 2. Whereas recess 110 of pellicle 100 of FIGS. 1A-1B is formed in top surface 112 of side member 106, recess 210 of pellicle 200 of FIG. 2 is formed in a side surface 213 of side member 206. Membrane 104 may be secured to the pellicle frame 207 by placing membrane 104 on top surface 212, stretching or otherwise expanding locking member 202 and positioning locking member 202 so that locking member 202 is substantially in alignment with recess 210, and releasing or contracting locking member 202 into recess 210 to capture some of the outer portion 104a of membrane 104 between recess 210 and locking member 202. As discussed above with reference to pellicle 100 (FIGS. 1A-1B), pellicle 200 may be secured to top surface 116 of photomask 108 by attachment member 114 disposed near a bottom of side member 206.

Figure 3:
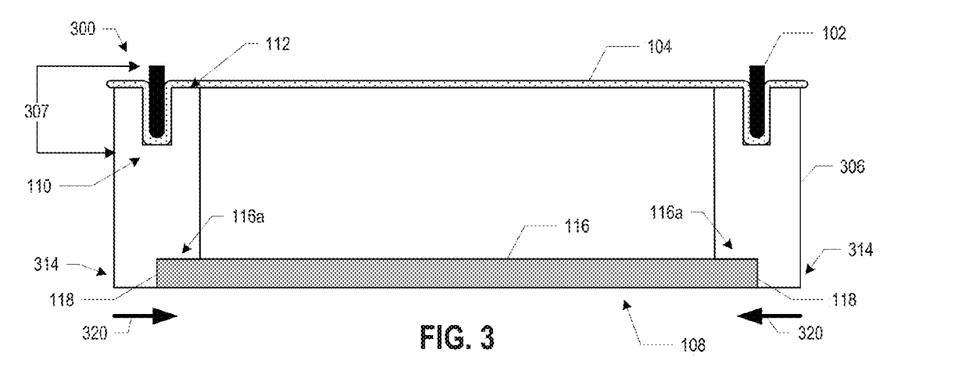
FIG. 3 is a side elevation sectional view of a third embodiment of a pellicle, with the pellicle secured to a photomask at least in part by contact between the pellicle frame and a side surface of the photomask.
Figure 4A:
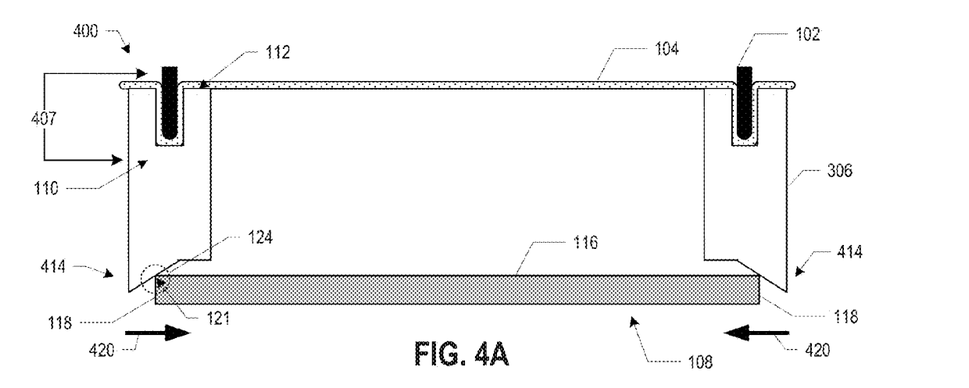
FIG. 4A is a side elevation sectional view of a fourth embodiment of a pellicle, with the pellicle secured to a photomask at least in part by contact between the pellicle frame and a side surface of the photomask.
Figure 4B:
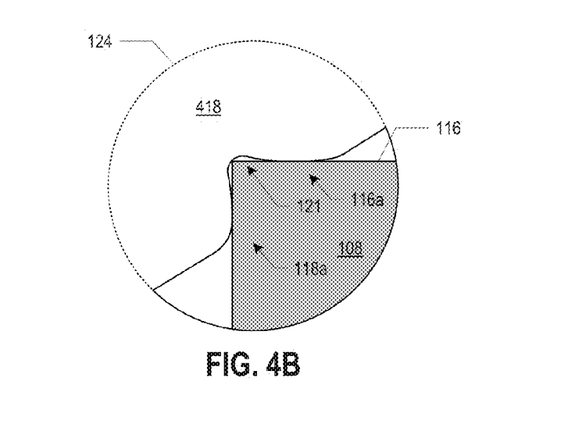
FIG. 4B is a blown-up, fragmentary side elevation sectional view of a portion of the pellicle-photomask arrangement of FIG. 4A.

Additional embodiments of non-adhesive attachment members are illustrated in FIGS. 3 and 4A-4B. FIG. 3 illustrates a pellicle 300 which is secured to photomask 108 at least in part by contact between a pellicle frame 307 and side surface 118 of photomask 108. Like pellicle frame 107 of FIGS. 1A-1B, pellicle frame 307 includes a side member 306 having recess 110 formed in first surface 112, and locking member 102 dimensioned to secure membrane 104 to pellicle frame 307 when a portion of membrane 104 is disposed between recess 110 and locking member 102. Pellicle frame 307 also has a non-adhesive attachment member 314 to contact side surface 118 of photomask 108 and to secure side member 306 to photomask 108. As illustrated in FIG. 3, attachment member 314 is positioned to be disposed adjacent to side surface 118 of photomask 108 when pellicle frame 307 is secured to photomask 308. Pellicle frame 307 may be dimensioned such that contact between attachment member 314 of pellicle frame 307 and side surface 118 of photomask 108 results in compression forces exerted by pellicle frame 307 on photomask 108 in a direction substantially perpendicular to side surface 118 of photomask 108. This direction is indicated by the arrows 320 in FIG. 3. By providing a snug fit between photomask 108 and attachment member 314, pellicle frame 307 may be secured to photomask 108.

As shown in FIG. 3, attachment member 314 may be rectangular in cross-section; in other embodiments, attachment member 314 may have any of a number of other cross-sectional shapes that provide for face-to-face contact between attachment member 314 and side surface 118 of photomask 108. Additionally, although attachment member 314 is depicted as extending below the top surface 116 of photomask 108 to end in approximate alignment with bottom surface 117 of photomask 108, other embodiments of attachment member 314 may not extend all the way to the bottom surface 117 of photomask 108. Instead, some embodiments may only contact a portion of side surface 118 of photomask 108 proximate to top surface 116 of photomask 108 and may not contact a portion of side surface 118 of photomask 108 proximate to bottom surface 117 of photomask 108.

FIGS. 4A and 4B illustrate a pellicle 400 which, like pellicle 300 of FIG. 3, is secured to photomask 108 at least in part by contact between a pellicle frame (here, pellicle frame 407) and side surface 118 of photomask 108. Like pellicle frame 307 of FIG. 3, pellicle frame 407 includes a side member 406 having recess 110 formed in first surface 112, locking member 102 dimensioned to secure membrane 104 to pellicle frame 407 when a portion of membrane 104 is disposed between recess 110 and locking member 102, and a non-adhesive attachment member (here, attachment member 414) to contact side surface 118 of photomask 108 and to secure side member 406 to photomask 108. Attachment member 414 is positioned to contact a top edge 121 of photomask 108 when pellicle frame 407 is secured to photomask 108. When pellicle 400 is secured to photomask 108, attachment member 414 extends below a plane of top surface 116 of photomask 108. In some embodiments, as shown in FIG. 4A, attachment member 414 is shaped as a wedge.

When pellicle 400 is secured to photomask 108, attachment member 414 may deform due the pressure between attachment member 414 and photomask 108 (e.g., due to the weight of pellicle 400 when positioned on photomask 108 and/or a force applied by a human or machine when pellicle 400 is positioned on photomask 108). FIG. 4B is a fragmentary side elevation sectional view of a portion 124 of the pellicle-photomask arrangement of FIG. 4A, illustrating an example of such a deformation. As shown, attachment member 414 may contact photomask 108 at a portion 116a of top surface 116 of photomask 108 and at a portion 118a of side surface 118 of photomask 108. Even when attachment member 414 is shaped as a wedge or other shape that nominally contacts only top edge 121, deformation of one or more of attachment member 414 and photomask 108 may provide contact between pellicle frame 407 and side surface 118 of photomask 108. Attachment member 414 may only contact a portion of side surface 118 of photomask 108 proximate to top surface 116 of photomask 108 and may not contact a portion of side surface 118 of photomask 108 proximate to bottom surface 117 of photomask 108.

As discussed above with reference to pellicle frame 307 of FIG. 3, pellicle frame 407 may be dimensioned such that contact between attachment member 414 of pellicle frame 407 and side surface 118 of photomask 108 results in compression forces exerted by pellicle frame 407 on photomask 108 in a direction substantially perpendicular to side surface 118 of photomask 108. This direction is indicated by the arrows 420 in FIG. 4A. By providing a snug fit between photomask 108 and attachment member 414, pellicle frame 407 may be secured to photomask 108.

In some embodiments, the attachment members of FIGS. 3 and 4A-4B extend around the entire periphery of photomask 108 when the respective pellicles are secured to photomask 108. In other embodiments, the attachment members may only contact photomask 108 at separate, discrete locations around the periphery of photomask 108. For example, if photomask 108 is circular, an embodiment of a pellicle frame may include three or more attachment members distributed about the circumference of photomask 108. If photomask 108 is rectangular, an embodiment of a pellicle frame may include a pair of attachment members disposed on opposite sides of photomask 108, four discrete attachment members disposed on the four sides of photomask 108, four discrete attachment members disposed at the four corners of photomask 108, or other such combinations. Embodiments including gaps between discrete attachment members may be advantageous in photolithography applications in which operations are performed under vacuum because the gaps allow gas to be drawn out from between the pellicle and the photomask.

The present embodiments of apparatuses and methods for securing a membrane to a pellicle frame using a locking member, and for securing a pellicle to a photomask, advantageously reduce (or eliminate) the amount of contaminant-generating adhesive used in pellicle-protected photolithography applications. By reducing or eliminating the adhesive used to secure a membrane to a pellicle frame, the contamination due to outgassing of the adhesive, and the potential optical distortion caused by adhesive, may be reduced or eliminated.

Additionally, because the attachment members disclosed herein do not include adhesive and reduce or minimize contact between the pellicle and the photomask, the pellicles disclosed herein may be removed from the photomask with less contamination and potential damage to the photomask than traditional pellicles. Consequently, the apparatuses and methods of the present disclosure enable a DUV or EUV photolithographic exposure process in which the pellicle is secured to the photomask during inspection, removed during exposure, and re-secured when exposure is complete. Such a process allows traditional organic pellicle membrane materials to be used to protect a photomask during transport and inspection, for example, without exposing the materials to damaging high-energy illumination during exposure. Existing techniques fail to enable such a process due to, among other things, the difficulty of removing a pellicle without contamination and damage.

FIGS. 5A-5F illustrate a photomask exposure process enabled by the apparatuses and methods disclosed herein. The pellicle depicted in FIGS. 5A-5F is pellicle 400 of FIGS. 4A-4B, but any of the pellicles with non-adhesive attachment members described herein may be used. Additionally, although pellicle 400 of FIGS. 4A-4B includes a membrane secured to a side member of a pellicle frame via a locking member, the process of FIGS. 5A-5F may also be used with pellicles having membranes secured to pellicle frames by adhesive or other means.

Figure 5A:
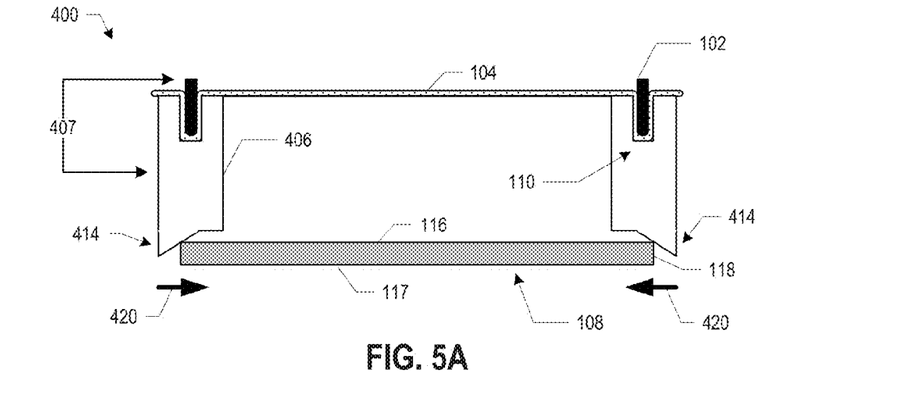
FIGS. 5A-5F are side elevation sectional views of the pellicle embodiment of FIGS. 4A-4B subsequent to various operations in a photomask exposure process.

In FIG. 5A, photomask 108 and pellicle 400 are provided. As discussed above, photomask 108 has top surface 116, side surface 118, and bottom surface 117. Pellicle 400 includes membrane 104 extending across pellicle frame 407 in a plane substantially parallel to a plane of top surface 116 of photomask 108. Pellicle 400 is secured to photomask 108 at least in part by contact between pellicle frame 407 and side surface 118 of photomask 108. In particular, as discussed above, pellicle frame 407 includes attachment member 414 which is disposed adjacent to side surface 118 of photomask 108. Contact between pellicle frame 407 and side surface 118 of photomask 108 may include compression forces exerted by pellicle frame 407 on photomask 108 in a direction substantially perpendicular to side surface 118 of photomask 108. A portion of membrane 104, proximal to pellicle frame 407, is disposed between recess 410 in side member 406 of pellicle frame 407 and locking member 102 positioned within recess 410.

Figure 5B:
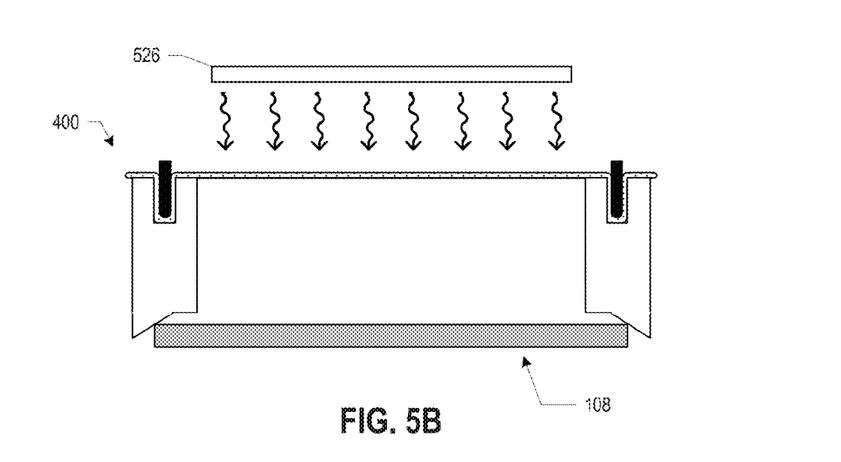

In FIG. 5B, photomask 108 is inspected by illuminating photomask 108 with an inspection illumination source 526. In some embodiments, inspection illumination source 526 may generate electromagnetic radiation with a wavelength of approximately 193 nm, 248 nm or 365 nm. During inspection, pellicle 400 is interposed between inspection illumination source 526 and photomask 108.

Figure 5C:
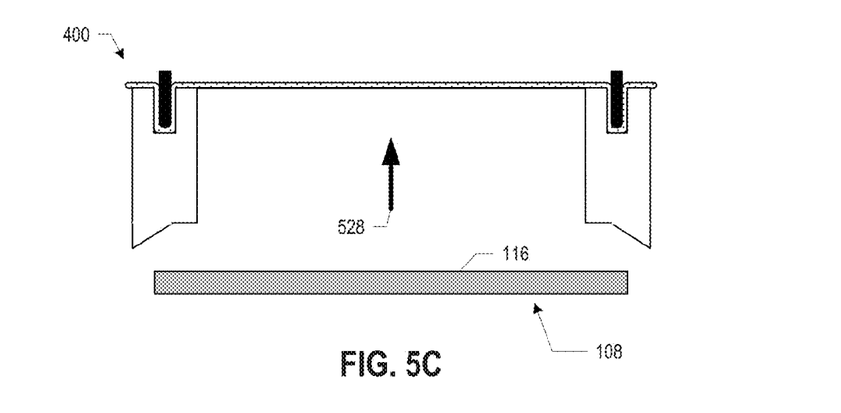

In FIG. 5C, after inspecting photomask 108 as shown in FIG. 5B, pellicle 400 is separated from contact with photomask 108. This separation is achieved by displacing pellicle 400 in a direction perpendicular to top surface 116 of photomask 108 (as indicated by the arrow 528). The separation may be assisted by one or more handles (such as handles 111 of FIGS. 1A-1B), not shown in FIG. 5C. Because no adhesive is used to secure attachment member 414 to photomask 108, no adhesive residue is left behind, nor is any other adhesive contamination generated.

Figure 5D:
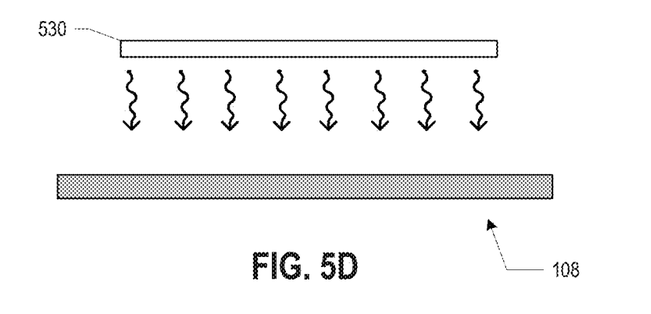

In FIG. 5D, photomask 108 is illuminated with an exposure illumination source 530 without pellicle 400 being interposed between exposure illumination source 530 and photomask 108. As discussed above, the exposure illumination may pass through photomask 108 to pattern a surface of a target wafer (not shown), or may reflect off photomask 108 to pattern a surface of a target wafer (not shown). In some embodiments, exposure illumination source 530 is a DUV illumination source. In some embodiments, exposure illumination source 530 is an EUV illumination source. For purposes of the present disclosure, DUV is defined as light with a wavelength less than 200 nm and EUV is defined as light with a wavelength less than 125 nm. In some embodiments, EUV is light with a wavelength of 13.5 nm.

Figure 5E:
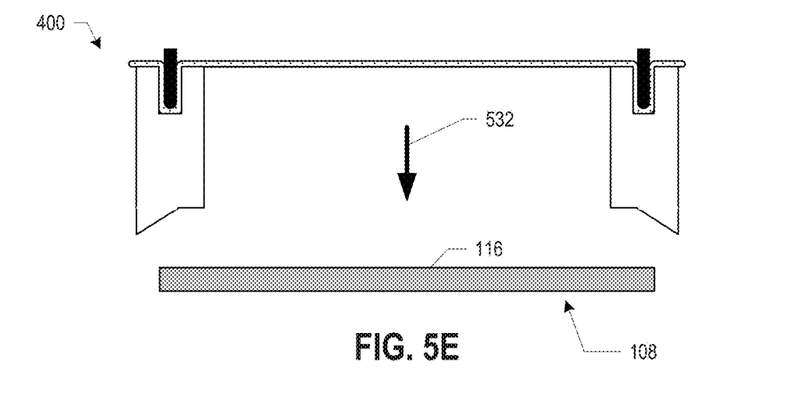
Figure 5F:
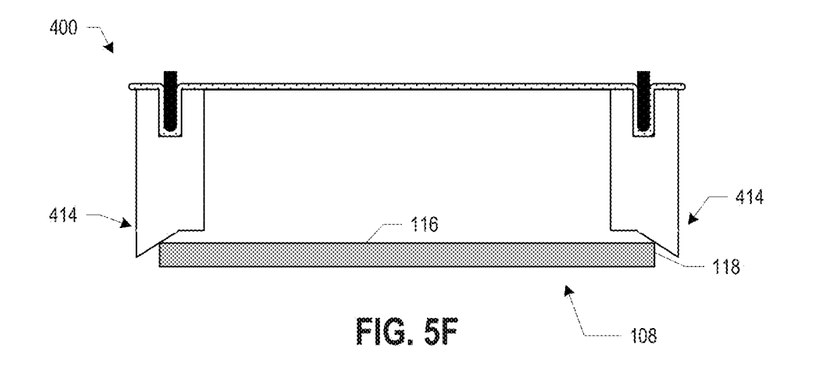

In FIGS. 5E and 5F, after the photomask is illuminated with exposure illumination source 530 as shown in FIG. 5D, pellicle 400 is resecured to photomask 108. Resecuring pellicle 400 to photomask 108 may include moving pellicle 400 in a direction perpendicular to and toward top surface 116 of photomask 108 (as indicated by the arrow 532). Attachment member 414 may contact side surface 118 of photomask 108 to secure photomask 108 to pellicle 400.

The specific embodiments disclosed and illustrated herein are not to be considered in a limiting sense as numerous variations are possible. The subject matter of the disclosure includes all novel and non-obvious combinations and subcombinations of the various elements, features, functions and/or properties disclosed herein. Similarly, where the claims recite "a" or "a first" element or the equivalent thereof, such claims should be understood to include incorporation of one or more such elements, neither requiring nor excluding two or more such elements.

It is believed that the following claims particularly point out certain combinations and subcombinations that are directed to one or more of the disclosed embodiments and are novel and non-obvious. Inventions embodied in other combinations and subcombinations of features, functions, elements and/or properties may be claimed through amendment of the present claims or presentation of new claims in this or a related application. Such amended or new claims, whether they are directed to a different embodiment or directed to the same embodiment, whether different, broader, narrower or equal in scope to the original claims, are also regarded as included within the subject matter of the present disclosure.

What is claimed is:

1. A pellicle frame comprising:
    a side member having a recess formed in a first surface thereof, the recess forming a closed path in the first surface;

a locking member dimensioned to secure a membrane to the pellicle frame when a portion of the membrane is disposed between the recess and the locking member; and a non-adhesive attachment member to secure the side member to a photomask.

2. The pellicle frame of claim 1, wherein the recess is formed near a top of the side member and the attachment member is disposed near a bottom of the side member.

3. The pellicle frame of claim 2, wherein the recess is formed in a top surface of the side member.

4. The pellicle frame of claim 1, wherein the recess is rectangular in cross-section.

5. The pellicle frame of claim 1, wherein the attachment member comprises a suction material to contact a top surface of the photomask.

6. The pellicle frame of claim 1, wherein, when the pellicle frame is secured to the photomask, the attachment member is positioned to contact a side surface of the photomask.

7. The pellicle frame of claim 6, wherein the attachment member is positioned to also contact a top edge of the photomask when the pellicle frame is secured to the photomask.

8. The pellicle frame of claim 7, wherein the attachment member is shaped as a wedge.

9. The pellicle frame of claim 6, wherein the attachment member is positioned to be disposed adjacent to a side surface of the photomask when the pellicle frame is secured to the photomask.

10. The pellicle frame of claim 1, further comprising:
a membrane having a portion disposed between the recess in the side member and the locking member to secure the membrane to the pellicle frame.

11. The pellicle frame of claim 10, wherein the membrane is secured to the pellicle frame by a snug fit between the locking member, the membrane and the side member.

12. The pellicle frame of claim 10, wherein the portion of the membrane disposed between the recess in the side member and the locking member forms a continuous closed path on the membrane.

13. The pellicle frame of claim 1, further comprising:
a handle portion positioned such that, when the pellicle frame is secured to the photomask, the pellicle frame is separable from the photomask by applying a force to the handle portion in a direction substantially perpendicular to and away from a plane of a top surface of the photomask.

* * * * *